United States Patent [19]

Mahant-Shetti et al.

[11] Patent Number: 5,352,924
[45] Date of Patent: Oct. 4, 1994

[54] BIPOLAR LAYOUT FOR IMPROVED PERFORMANCE

[75] Inventors: Shivaling Mahant-Shetti, Richardson; David B. Scott, Plano, both of Tex.

[73] Assignee: Texas Instruments Incorporated, Dallas, Tex.

[21] Appl. No.: 48,531

[22] Filed: Apr. 14, 1993

[51] Int. Cl.⁵ .............................. H01L 29/72
[52] U.S. Cl. .................. 257/565; 257/579; 257/588; 257/593
[58] Field of Search ............ 257/565, 566, 579, 588, 257/592, 593

[56] References Cited

U.S. PATENT DOCUMENTS

| | | | |
|---|---|---|---|
| 4,994,880 | 2/1991 | Kato et al. | 257/579 |
| 5,227,660 | 7/1993 | Horiuchi et al. | 257/588 |
| 5,237,200 | 8/1993 | Nanba et al. | 257/565 |

*Primary Examiner*—Mark V. Prenty
*Attorney, Agent, or Firm*—Mark A. Valetti; Wade James Brady; Richard L. Donaldson

[57] ABSTRACT

A bipolar transistor is disclosed which substantially reduces prior art problems associated with current crowding by maximizing the active periphery of the transistor's emitter [10].

3 Claims, 8 Drawing Sheets

BIPOLAR LAYOUT FOR IMPROVED PERFORMANCE

BACKGROUND OF THE INVENTION

There are several considerations in bipolar transistor design and fabrication. Most notably, capacitance, particularly between the base and emitter of the transistor, should be minimized in order to attain a high rate of transistor switching. Minimal capacitance should also exist between the base and collector for the same reason. Minimization of capacitance through minimizing base-emitter area has been the major focal point concerning the layout of the base and emitter. Generally, not much emphasis has been placed on the reduction of current crowding. Bipolar transistors in recent technology tend to show considerable current crowding owing to their small and ever decreasing geometries. Current crowding results in most bipolar action occurring on the periphery of the transistor and in fact the bipolar action may further be affected by the current path from the base contact to the specific emitter edge. Further, full benefit is not received from the conventional bipolar transistor due to the fact that the most of its elemental constituents (i.e. its base, emitter and collector) are not effectively used during operation as shall be explained below.

One commonly used bipolar fabrication structure is shown in FIG. 1, a drawing which illustrates the top view layout of base contact 2 with respect to emitter 4. Although minimization of base resistance ($r_b$) was the primary motivation behind the creation of this layout, note that the location of two base contacts as shown in FIG. 1, allows use of both sides of the emitter, each labeled FF and RR respectively, during bipolar action. In contrast, in the case where a single base contact is paired with a single emitter, only one side of the emitter is active. Current crowding would render the other sides of the emitter inactive. FIG. 2 is a drawing of such a case with a partial circuit schematic superimposed over the top view layout of single base contact 2 paired with single emitter 4. The partial circuit schematic shown in FIG. 2 is the result of assigning to a semiconductor chip surface area, distributed resistances and distributed transistors along with associated transistor modeling parameters (i.e. $r_b$ and emitter resistance, $r_e$). In FIG. 2, distributed bipolar transistors are labeled T1, T2, and T3 respectively. Each distributed transistor is assumed to have the same Beta ($\beta$). Further, the modeled parameters such as base resistance and emitter resistance respectively, are assumed to be the same The $r_b$ and $r_e$ are indicated according to subscript for its associated distributed transistor. Resistive paths from base contact 2 to emitter 4 are represented by resistors labeled R. Although not all resistive paths are illustrated, of those which are illustrated, the relative resistance of that path increases with the number of resistors along that path. Base contact 2 is assumed to be equipotentialed in voltage. As is readily apparent from FIG. 2, distributed transistor T2 is in a greater active state than distributed transistors T1 and T3 due to the lesser voltage at the bases of distributed transistors T1 and T3 as compared with the voltage at the gate of distributed transistor T2. This lesser voltage results from the greater mount of resistance encountered along circuit paths to the base of distributed transistors T1 and T3 as compared with distributed transistor T2.

Conceivably, distributed transistors like T1, T2 and T3 can be modeled all along the periphery of emitter 4. FIG. 3 best illustrates this with a schematic drawing which models the distributed resistances and distributed transistors all along the periphery of the emitter. FIG. 3 additionally illustrates the relative location of emitter 4 to base contact 2 through the superposition of the layout over the schematic portion of FIG. 2. The modeled distributed transistor resistances such as $r_b$ and $r_e$ are lumped together with other resistances and all resistances are indicated by resistors R. FIG. 3 once again demonstrates that the farther away the distributed transistor is from base contact 2, the less turned on or less active the distributed transistor is. Accordingly, distributed transistor T3 is in the most active state as compared with the remaining distributed transistors since it is physically nearer base contact 2 than the remaining distributed transistors. Further, distributed transistors T5 through T8 near side RR, are likely barely in an active state such that they can be considered turned off due to current crowding, the effect of which has been illustrated via the resistance paths shown in foregoing examples. Thus, a substantial portion of the distributed transistor hardly participates during transistor operation. Therefore a need exists to improve the effectiveness and efficiency of a bipolar transistor.

SUMMARY OF THE INVENTION

A bipolar transistor is disclosed wherein the active periphery of its emitter is maximized while the active periphery of its base is minimized.

BRIEF DESCRIPTION OF THE INVENTION

Figure 1:
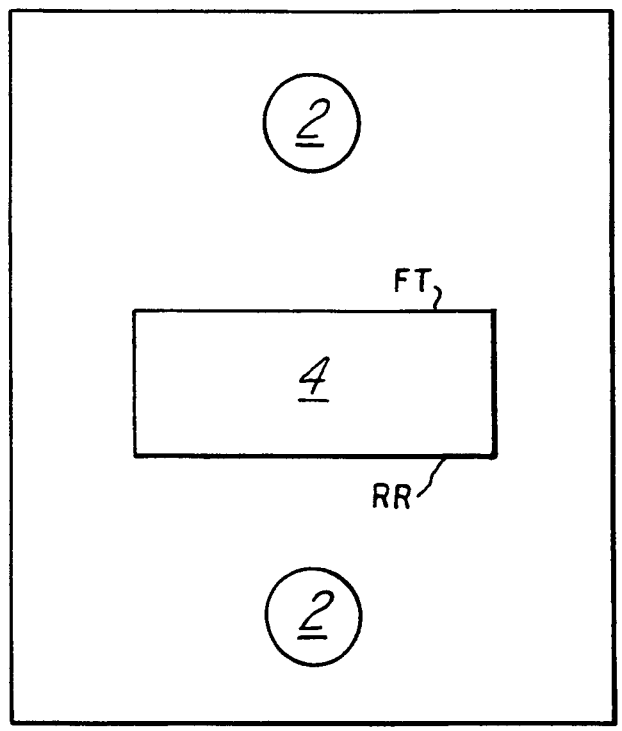
FIG. 1 illustrates a top view layout of the base contact with respect to the emitter.
Figure 2:
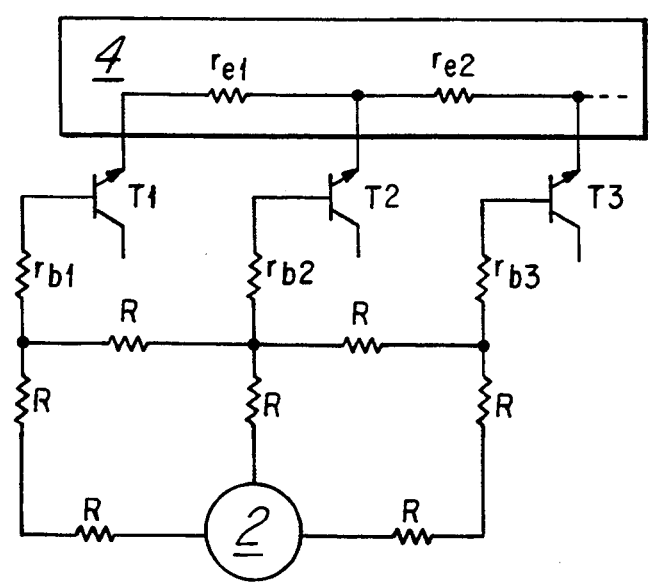
FIG. 2 is a drawing of a partial circuit schematic superimposed over the top view layout of a single base contact paired with single emitter.
Figure 3:
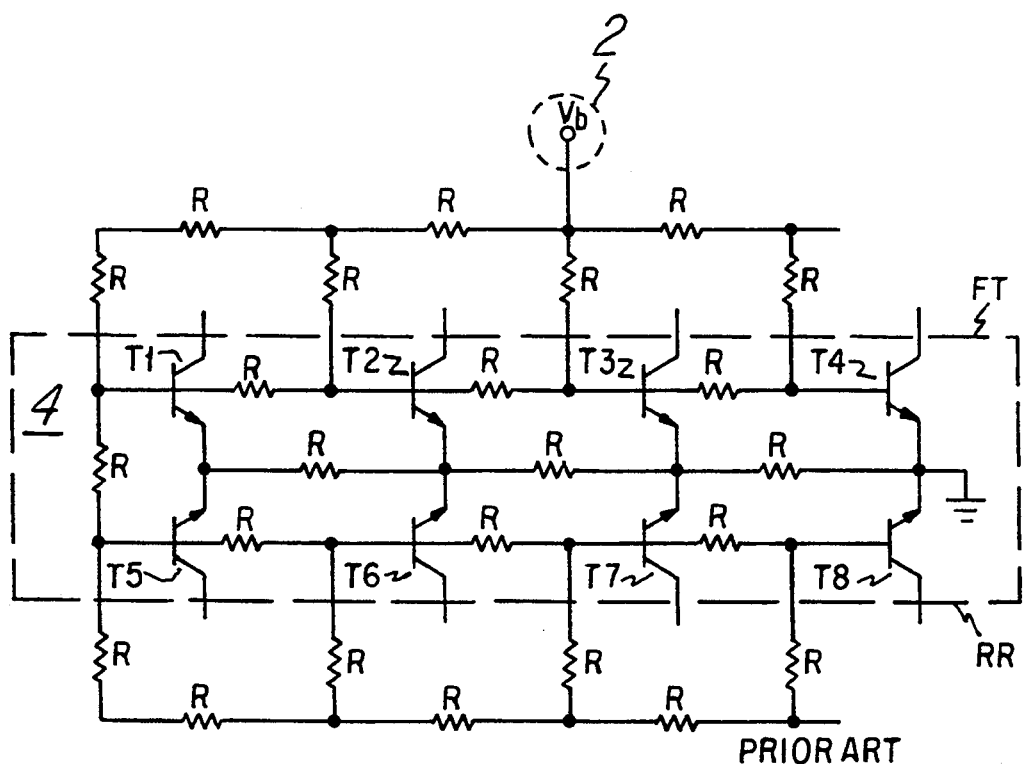
FIG. 3 illustrates a schematic drawing which models distributed resistances and distributed transistors along the periphery of an emitter.
Figure 4A:
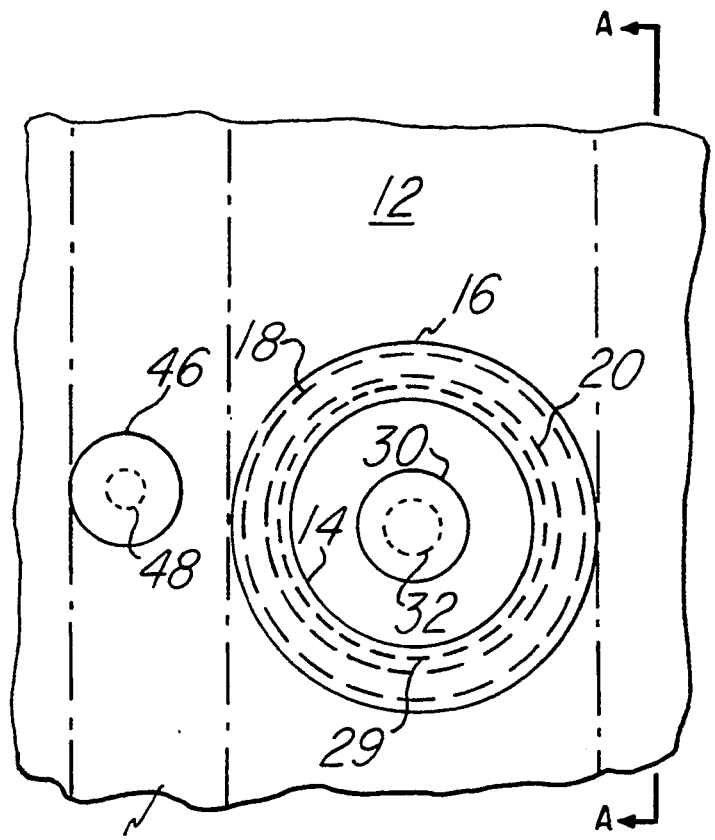
Figure 4B:
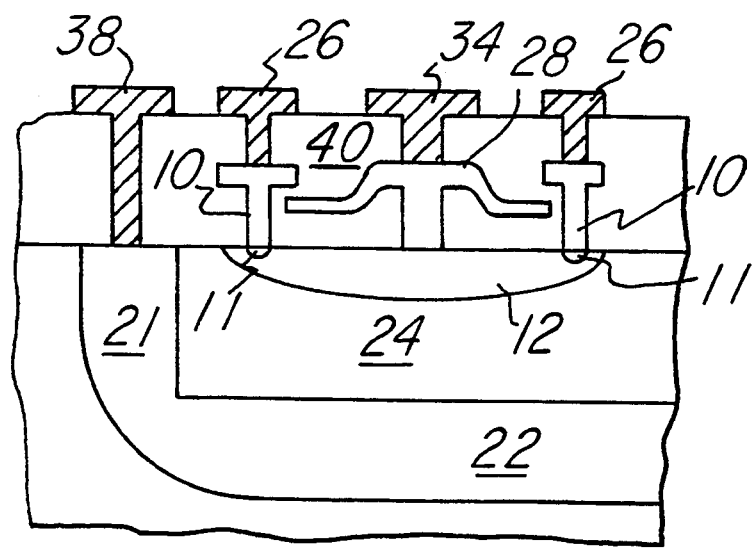

FIG. 4a top view of a structure embodying the layout of the invention and FIG. 4b a cross-sectional view of this structure along lines AA'.

Figure 5:
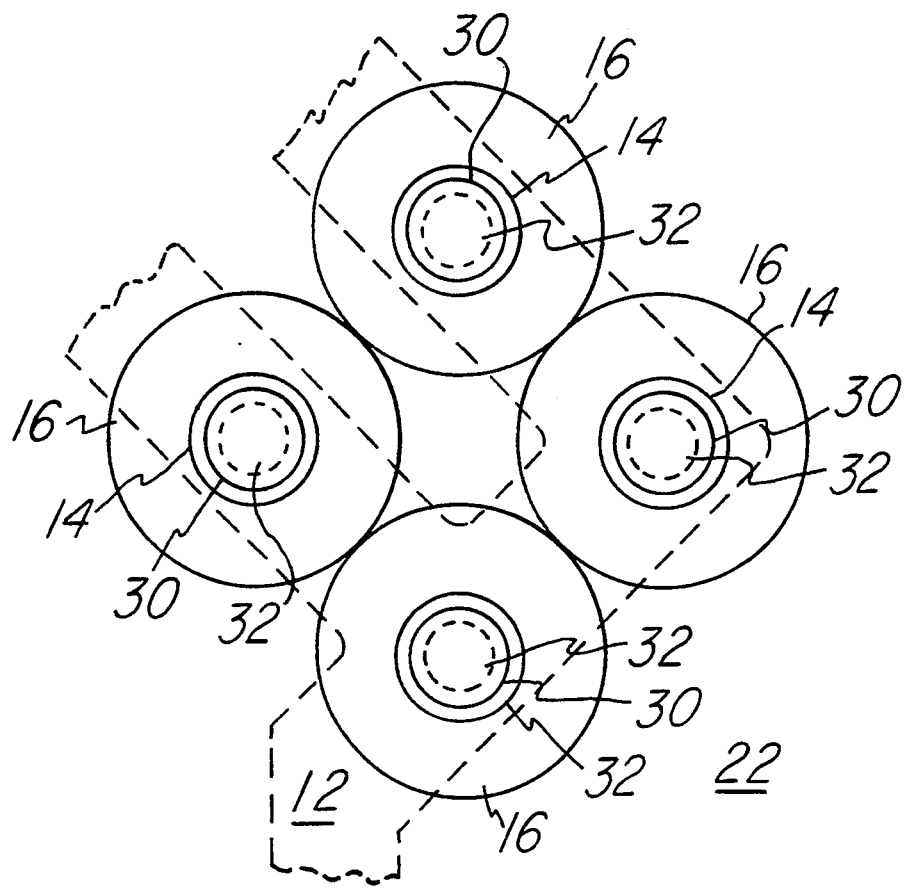

FIG. 5 illustrates a top view layout of a several structures having circular symmetry stacked in a single collector well with a hexagonal dose packed formation.

Figure 6:
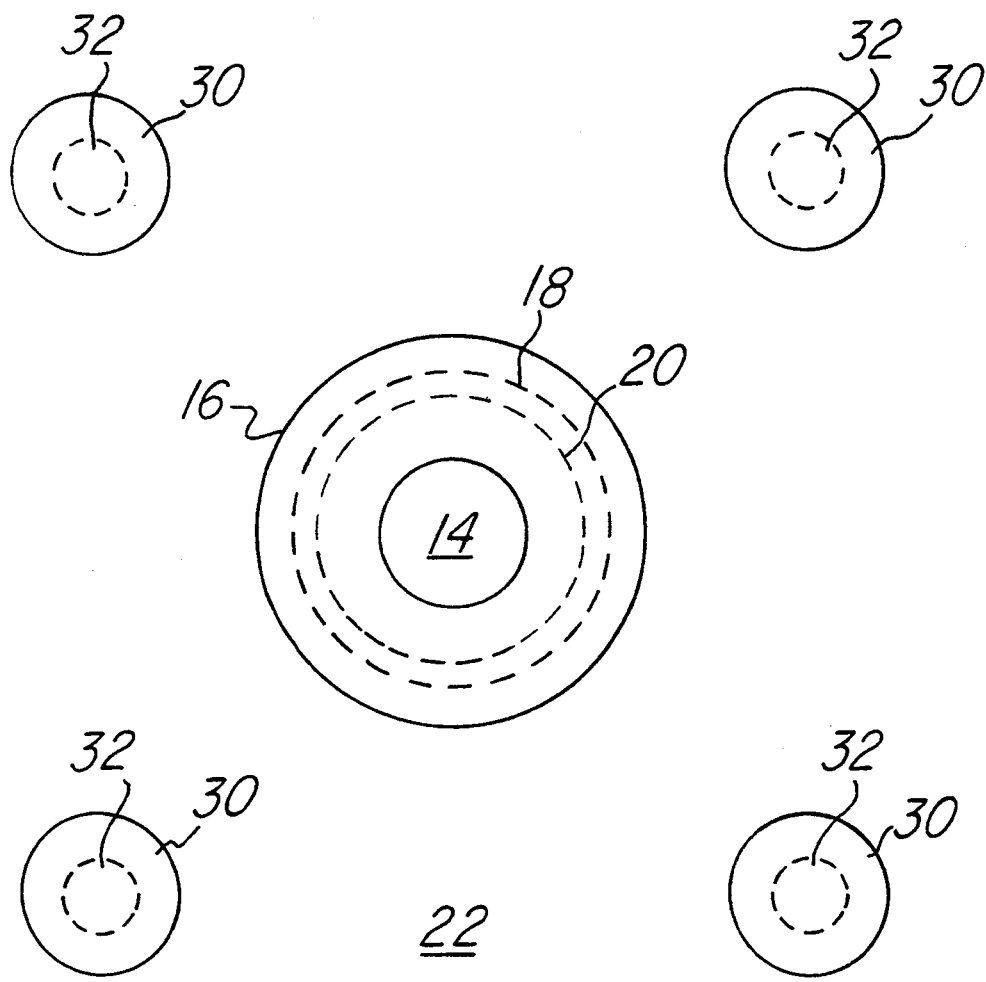

FIG. 6 illustrates an a top view layout of an alternative embodiment of the invention. In this embodiment, the emitter and base of FIGS. 4a and 4b have been interchanged.

Figure 7:
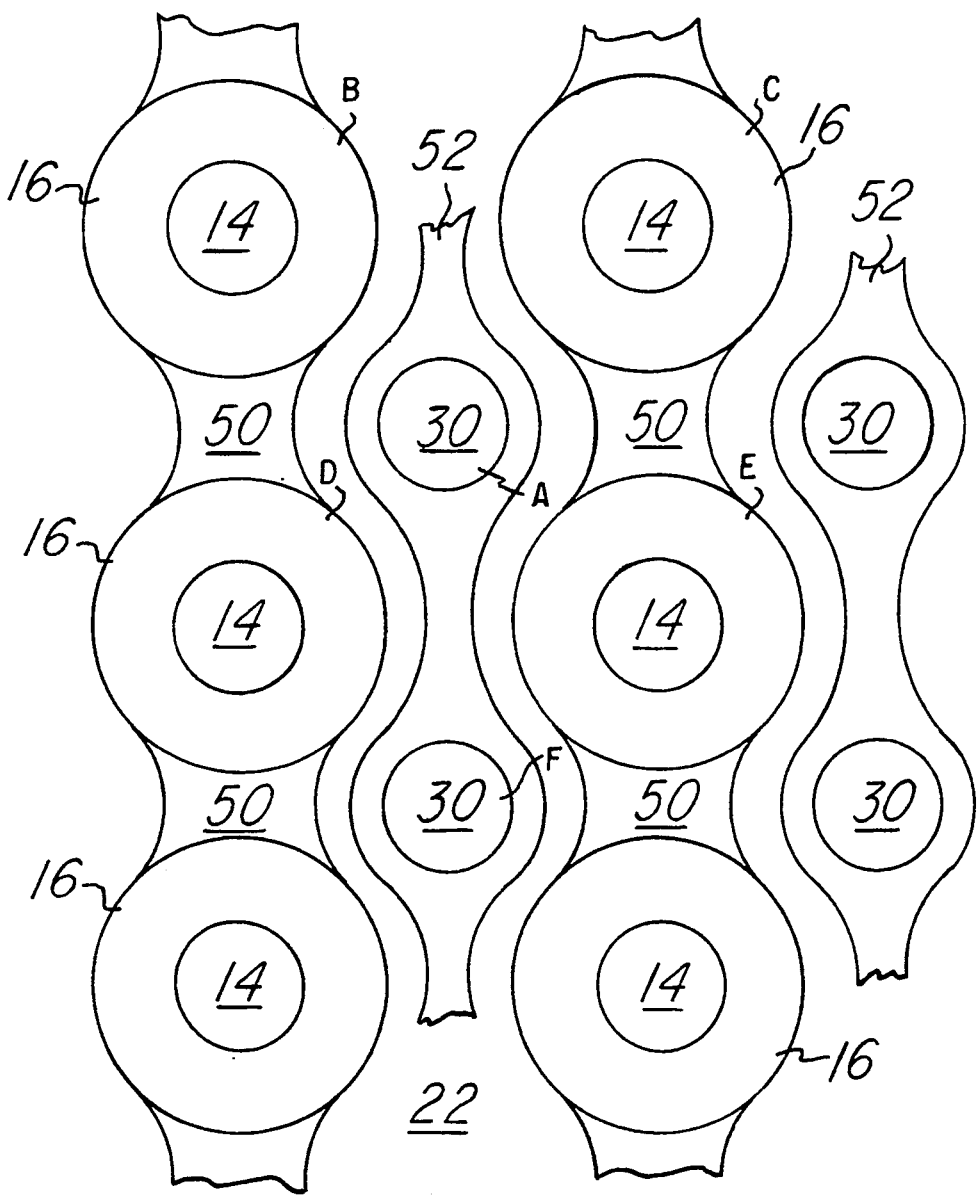

FIG. 7 illustrates the embodiment of the invention illustrated in FIG. 6 used with a hexagonal dose packed formation.

Figure 8:
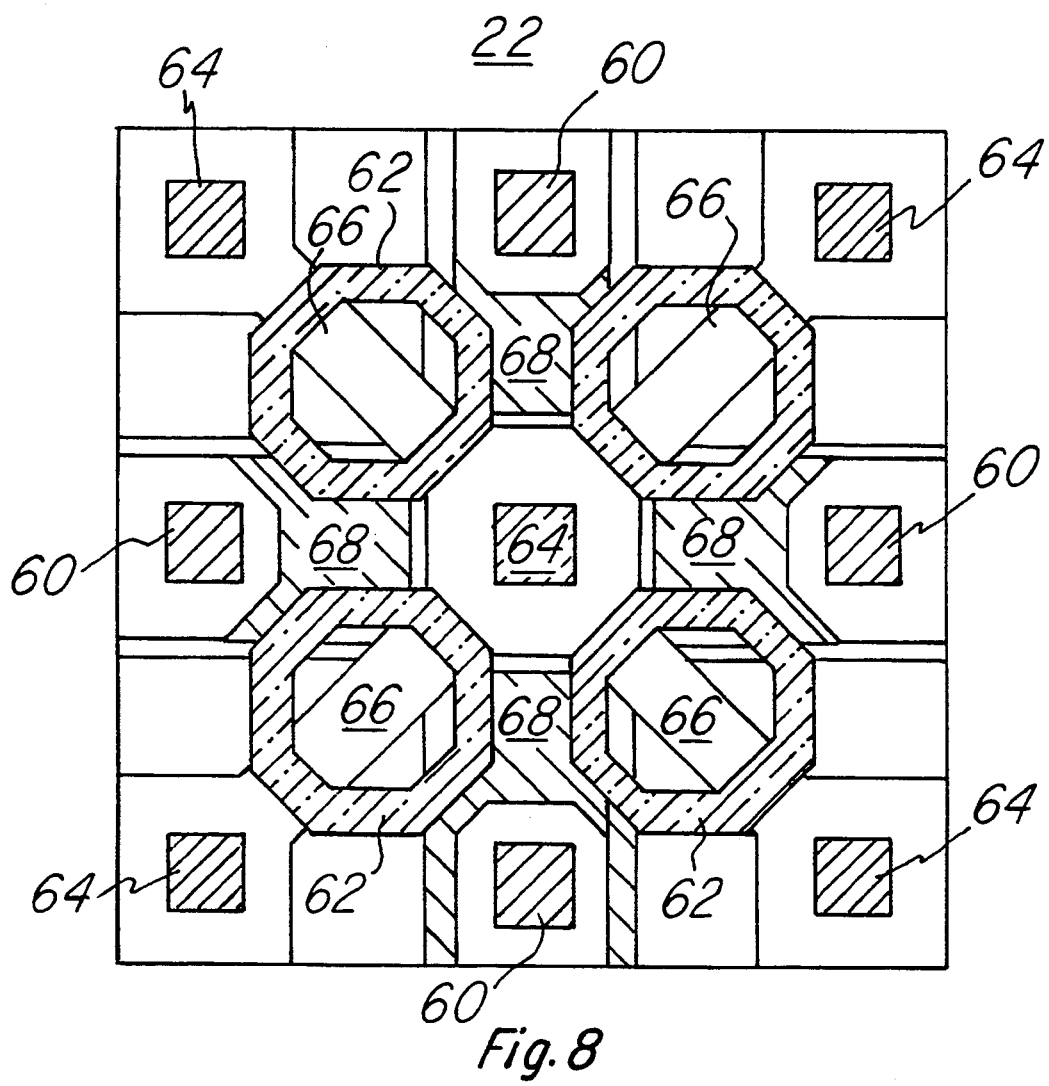

FIG. 8 illustrates a top view layout of another embodiment of the invention showing the spacing between the emitter contact and the poly emitter as being equidistant to the spacing between the base contact and the poly emitter.

Figure 9:
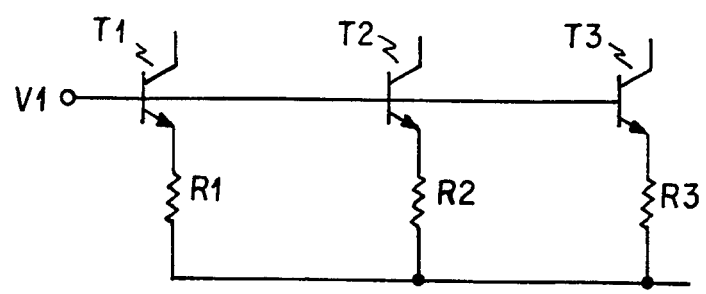

FIG. 9 which illustrates a schematic drawing of three distributed transistors, T1, T2 and T3 which have negligible base resistance and varying distributed emitter resistances R1, R2, and R3.

Figure 10:
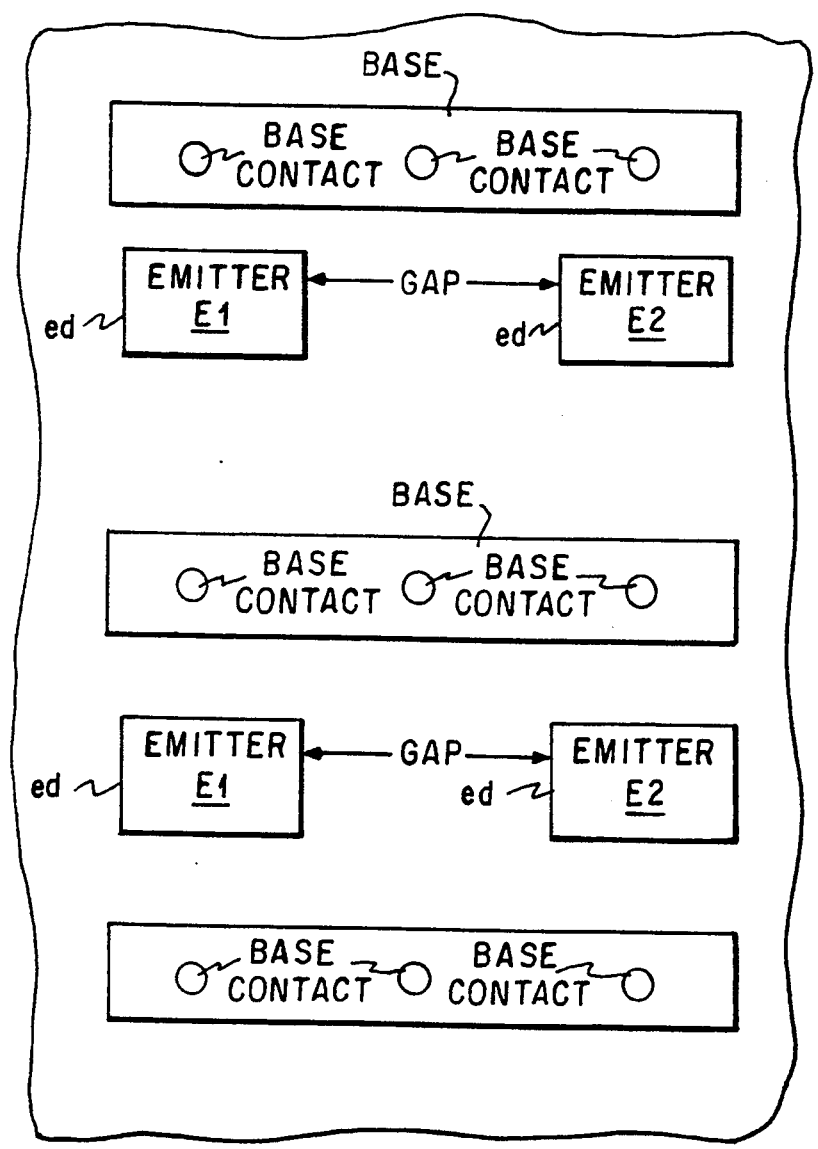

FIG. 10 illustrates a top view layout of another embodiment of the invention. Like the other embodiments of the invention, the effective active transistor size has been increased by increasing the active periphery of the transistor which includes a base and an emitter as shown.

DETAILED DESCRIPTION OF THE INVENTION

The invention solves the foregoing problems of improving bipolar transistor effectiveness and efficiency by increasing the active periphery of the emitter and decreasing the active periphery of the base. Doing so will increase the operating speed of the bipolar transistor of the invention as compared with a bipolar transistor not constructed according to the invention. The invention can be fabricated as a integrated circuit using well known semiconductor fabrication methods.

FIG. 4a is a top view of a structure embodying the layout of the invention and FIG. 4b is a cross-sectional view of this structure along lines AA'. With reference to FIGS. 4a and 4b, a cylindrically shaped emitter 10 is shown lying between circles 14 and 16. All circles referenced herein are actually hexagonal in shape. Circles are used herein merely to approximate hexagons for the purpose of facilitating illustration. The portion 11 of emitter 10 contacting base 12 is lies between hidden circles 18 and 20. Collector 21 includes a diffusion under field portion (DUF) 22 in semiconductor substrate 24. Emitter 10 preferably is a polycrystalline semiconductor (poly) emitter. Such poly material can for instance be polycrystalline silicon (polysilicon). Metal 1 emitter contact 26 is shown contacting poly emitter 10. Metal 1 is preferably comprised of tungsten although other metals such as aluminum can be used. Poly emitter 10 primarily allows a shallow diffusion for the emitter. However, the poly need not be used and metal 1 contact 26 can contact directly to diffused portion 11. Base contact 28 is made of poly semiconductor, the narrow portion of which lies between circle 30 and hidden circle 32. Metal 1 base contact 34 is shown contacting poly base contact 28. Poly base contact 28 allows minimization of both the collector-base capacitance and base resistance in a self aligned structure. Consequently, this poly base structure further increases transistor speed. Base contact 28 lies within circle 29 as indicated in figure 4a. (For ease of illustration, circle 29 is will not be illustrated in subsequent figures.) However, note that metal base contact 34 can connect directly to base 12. Metal 1 collector contact 38 can connect directly, between circle 46 and hidden circle 48 to collector 21. An insulator 40 such as oxide surrounds the contacts discussed as shown.

The structure illustrated in FIGS. 4a and 4b provides an emitter which is substantially equidistant from the base at a given radius from the center of the base contact. In the invention, the active periphery of the emitter has been maximized while the active periphery of the base has been minimized. The overall structure has a circular symmetry and several of these structures can be stacked in a single collector well with a hexagonal dose packed formation. FIG. 5 illustrates a top view layout of such a structure. For ease of illustration, hidden circles associated with the emitter have been omitted. Each circle should fit into an associated hexagon, the hexagons being in a close packed formation. Minimum sized transistors with this type of topology can be quite large. Note that base 12 is associated with each transistor site, a transistor site being defined as a region wherein transistor action occurs and which includes a base, collector and emitter. By connecting the bases together (for instance with metal), and the emitters together (for instance with poly) and using a common collector region, the structure as a whole can act like a single transistor. The active periphery of such a transistor has been increased due to the equidistant relationship between the base contact and the emitter such that the effects of current crowding have been substantially reduced. Note that since the collector 22 extends under the base and emitter no substantial current crowding like phenomenon takes place with respect to the collector.

An alternative embodiment of the invention is illustrated in the top view layout of FIG. 6. In this embodiment, the emitter and base of FIGS. 4a and 4b have been interchanged. Here, the emitter, located between circles 14 and 16 is equidistant from each associated base contact located in circle 30.

The embodiment illustrated in FIG. 6 can likewise be used with a hexagonal close packed formation. FIG. 7 illustrates such an embodiment. As with FIG. 6, hidden circles have been omitted. The poly emitter lies between circles 14 and 16. A row of such emitters can be connected by poly region 50 as shown. Further, a row of base contacts within circle 30 can be connected by poly region 52 as shown. It is possible for each transistor site connected together by regions 50 and 52 to act like a single transistor. As shown, each base contact located within circle 30 can serve as a primary base contact for 4 surrounding transistors. For instance, base contact A serves as the base contact for transistors located at sites B, C, D, and E. However, note that base contact F serves as well as a primary base contact for transistors located at sites D and E. Note further that due to current crowding, transistor operation can occur for instance at site D involving separate base contacts such as base contacts A and F. Current crowding allows base contact A to be involved with transistor action over a certain portion of transistor site D while base contact F is involved with transistor action over another portion of transistor site D.

FIG. 8 illustrates a top view layout of another embodiment of the invention. Here, spacing between the emitter contact 60 and the poly emitter 62 is equidistant to the spacing between base contact 64 and poly emitter 62. Each base contact 64 can be connected together with metal line 66 shown superimposed over poly emitter 62. Likewise, each emitter contact 60 can be connected together with poly 68. This embodiment like the foregoing embodiments reduces problems of current crowding. Additionally, poly 68 can be routed into shapes of a selected resistance in order to control the biasing of the distributed transistors formed using the layout of FIG. 8. This aspect of the invention is further explained with reference to FIG. 9 which illustrates a schematic drawing of three distributed transistors, T1, T2 and T3 which have negligible base resistance and varying distributed emitter resistances R1, R2, and R3. Assuming distributed transistor T1 represents the distributed transistor in the most active state, distributed transistors T2 and T3 will be less turned on due to the fact that they have higher base and emitter resistances (assuming distributed transistors T1, T2, and T3 are equal in other respects and that R1<R2 and R1<R3). Since the base emitter voltage, $v_{BE}$, is proportional to V1 minus emitter current (I) times emitter resistance R, (VBE=V1−IR), with emitter current being proportional to $I_o$ times $e^{VBE}$ ($I_o$ being a temperature dependent quantity which increases with temperature) distributed transistors T2 and T3 can be made more active by increasing the resistance value of R1 by increasing the distance over which poly 58 is routed. Likewise, the same can be done for distributed resistance values of R2 and R3 such that distributed transistors T1, T2 and T3 more equally take part in the conduction of current.

FIG. 10 illustrates a top view layout of another embodiment of the invention. Like the other embodiments of the invention, the effective active transistor size has been increased by increasing the active periphery of the transistor which includes a base and an emitter as shown. Note that the base contacts are shown in FIG. 10. However, the emitter contacts have not been indicated. The emitter contacts can be placed according to the foregoing discussed embodiments of the invention described with reference to FIG. 8 such that selective biasing of distributed transistors can be accomplished using poly. Further, the collector and collector contact has not been shown in FIG. 10. Since a DUF collector is preferably used, this makes the placement of collector contact not overly critical. The emitter shown in FIG. 10 is broken into a plurality of portions, two of which E1, and E2 are shown in FIG. 10. By breaking the emitter into portions (resulting in and referred to as segmented emitters), edges ed play a greater role in the conduction of current than they would have, had a single continuous segment of emitter been used instead. The gap between emitter portions provides better base connection to edges ed and hence provide better transistor action. As with the previous embodiments the emitter portions can be connected together with poly. Likewise the base contacts can be connected together with a metal. An additional benefit of the this embodiment of the invention with segmented emitter portions is the effective reduction in capacitance between the collector and transistor substrate as well as between the base and collector. This leads to an attendant improvement in performance. Silicon data taken on an experimental structure incorporating this embodiment of the invention indicates that the base resistance of the transistors fabricated are lower than those without the segmented emitters. An experimental emitter coupled logic circuit incorporating this embodiment showed approximately a 20% improvement in performance.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by persons of ordinary skill in the art having reference to this description. It is contemplated that all such changes and additional embodiments are within the spirit and true scope of the invention as claimed below.

We claim:

1. A plurality of integrated circuit devices being arranged in a hexagonal close packed formation in a plane, wherein each said device is of circular symmetry and comprises:
   a base;
   a collector;
   a cylindrically shaped emitter, which during device operation, said base, emitter and collector operate collectively as a transistor; and
   a plurality of base contacts spaced apart from said emitter at substantially equal radii from the center of mass of said cylindrically shaped emitter.

2. A plurality of integrated circuit devices as recited in claim 1 wherein selected emitters of said devices are connected together with poly and wherein selected bases of said devices are connected together.

3. A plurality of integrated circuit devices as retired in claim 1 wherein poly connects selected emitters of said devices, said poly being routed so as to maximize the active portion of said devices.

* * * * *